United States Patent [19]
Osawa et al.

[11] Patent Number: 6,031,276
[45] Date of Patent: Feb. 29, 2000

[54] SEMICONDUCTOR DEVICE AND METHOD OF MANUFACTURING THE SAME WITH STABLE CONTROL OF LIFETIME CARRIERS

[75] Inventors: Akihiko Osawa, Tokyo; Yoshiro Baba, Yokohama; Masanobu Tsuchitani; Shizue Hori, both of Tokyo, all of Japan

[73] Assignee: Kabushiki Kaisha Toshiba, Kawasaki, Japan

[21] Appl. No.: 08/950,841

[22] Filed: Oct. 15, 1997

[30] Foreign Application Priority Data

Oct. 17, 1996 [JP] Japan ................................ 8-274780
Jul. 25, 1997 [JP] Japan ................................ 9-200064

[51] Int. Cl.⁷ ........................... H01L 26/30; H01L 29/74
[52] U.S. Cl. ........................ 257/617; 257/109; 257/131; 257/156
[58] Field of Search ........................... 257/156, 617, 257/109, 131, 590, 107, 130, 376

[56] References Cited

U.S. PATENT DOCUMENTS 4,920,396  4/1990  Shinohara et al. ................ 257/376
4,972,239  11/1990  Mihara .............................. 257/590
5,243,205  9/1993  Kitagawa et al. ................. 257/617
5,250,446  10/1993  Osawa et al. ...................... 438/798

FOREIGN PATENT DOCUMENTS

0 032 386  7/1981  European Pat. Off. .
0 297 325  1/1989  European Pat. Off. .
0 327 316  8/1989  European Pat. Off. .
2 079 051  1/1982  United Kingdom .

*Primary Examiner*—Tom Thomas
*Assistant Examiner*—Hung Kim Vu
*Attorney, Agent, or Firm*—Oblon, Spivak, McClelland, Maier & Neustadt, P.C.

[57] ABSTRACT

A semiconductor device includes a plurality of defect layers separated from one another in the semiconductor layer. A distance separating any adjacent ones of the defect layers is kept such that they are prevented from contacting each other and those regions having effect of shortening a carrier lifetime overlap each other.

5 Claims, 11 Drawing Sheets

SEMICONDUCTOR DEVICE AND METHOD OF MANUFACTURING THE SAME WITH STABLE CONTROL OF LIFETIME CARRIERS

BACKGROUND OF THE INVENTION

1. Field of the Invention

The present invention relates to a semiconductor device typically to be used for a switching device that is structurally featured to stably control the lifetime of carriers, and a method of manufacturing the same.

2. Discussion of the Background

The technique of controlling the lifetime of carriers is important for semiconductor devices used for switching devices such as thyristors to realize a swift switching action, because carriers can be annihilated quickly for a swift switching action when the switch is turned off by shortening the carrier lifetime.

With a known and commercially popular technique of shortening the carrier lifetime, a semiconductor substrate is irradiated typically with protons to produce a defect layer in the semiconductor substrate and utilize the defect layer as recombination centers for carriers.

Particularly, it is well known that in the case where a defect layer is formed in the vincity of the junction plane between a p-type semiconductor layer and an n-type semiconductor layer, it is possible to efficiently annihilate the carriers because the holes as minor carriers injected into the n-type semiconductor from the p-type semiconductor can be swiftly recombined with the electrons when the reverse bias is applied.

Figure 1:
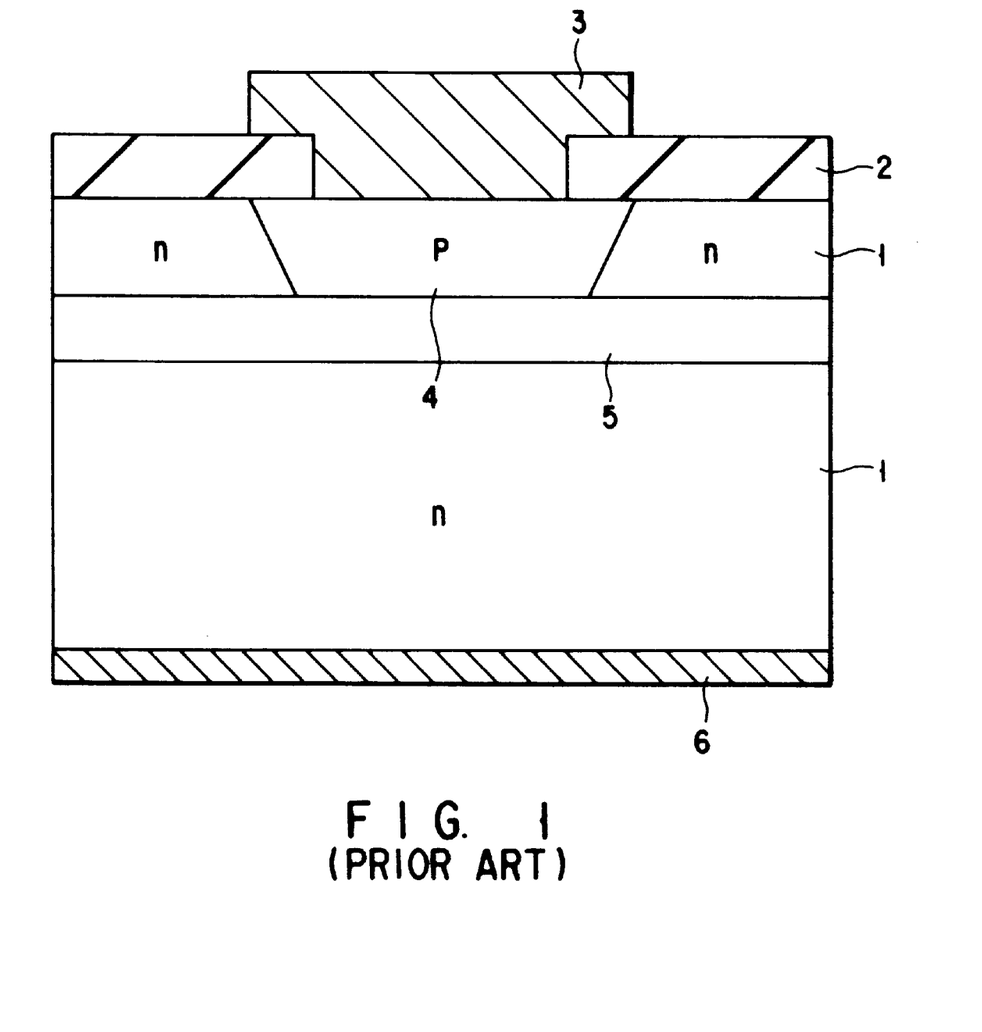
FIG. 1 is a schematic cross sectional view of a conventional semiconductor device, illustrating its structure.

FIG. 1 of the accompanying drawing illustrates a conventional semiconductor device, which is a diode in which a defect layer is formed. The illustrated known diode comprises an n-type semiconductor substrate 1, a p-type semiconductor layer 4 formed in part of the n-type semiconductor substrate 1 to realize a pn junction on the interface of the p-type semiconductor layer 4 and the n-type semiconductor substrate 1. The p-type semiconductor layer 4 and the n-type semiconductor substrate 1 are connected to electrodes 3 and 6, respectively. The diode further comprises a defect layer 5 in the n-type semiconductor substrate 1 of the pn junction.

In such a semiconductor device, a defect layer 5 can be produced by irradiating a device that has been prepared by forming a p-type semiconductor layer 4 in part of an n-type semiconductor substrate 1 and then forming electrodes 3 and 6 thereto, with protons typically at a dose of 1 to $5,000 \times 10^{10}$ cm$^{-2}$ and accelerating them with an energy level of 0.5 to 4.0 MeV.

With the consideration of a width of the formed defect layer 5, the acceleration energy is selected so that each position where the protons are stopped has a little depth from the pn junction plane and the defect layer 5 contacts with the pn junction plane. For example, the position where the protons are stopped may be selected to be 5 μm further deeper than that of the pn junction plane because the HWHM of the defect layer is generally assumed to be approximately 5 μm.

However, it is difficult to control to form the defect layer 5 so as to always contact with the pn junction plane. If the defect layer 5 overlaps the p-type semiconductor layer 4, the region of defect layer overlapping the p-type semiconductor layer 4 does not contribute to the shortening of lifetime, resulting in lowered switching performance. Also, the degree of lowering of the switching performance is dispersed because the volume of the overlapping region is changed.

Since such a defect layer is easily recovered at the temperature of 300 to 400° C. and does not result in the recombination center for carriers, a thermal process can be generally carried out after the irradiation with protons. For forming Al electrode 3, for example, the thermal process referred to as a sintering whose temperature is approximately 400° C. is required. Accordingly, the irradiation with protons is generally executed in the last step of the semiconductor manufacturing.

In order to swiftly annihilate carriers injected into the n-type semiconductor layer 1 from the p-type semiconductor layer, it is preferable to form the defect layer 5 in the vicinity of the pn junction plane. By the irradiation with protons from the reverse side of the semiconductor substrate, it is possible to prevent the defect layer from overlapping the p-type semiconductor layer 4. However, since the semiconductor substrate has the width of several hundred micrometers and it requires very high acceleration energy to accurately form the defect layer in the vicinity of the pn junction plane, it is impossible to realize the above formation of the defect layers.

Moreover, the density of defect shows its maximum at the position where the protons are stopped, in which a small number of defects are produced. Assume that, in this condition, the irradiation with protons is executed from the reverse side of the semiconductor substrate 1. Consequently, the defects are produced in the n-type semiconductor layer 1, resulting in increase of the resistance of the n-type semiconductor layer 1.

Due to these reasons, the irradiation with protons is executed from the reverse side of the semiconductor substrate after the formation of the interlayer insulation film 2, the Al electrode 3, or the like. Thus, there is a probability that the position where the protons are stopped is changed in accordance with the shape of the interlayer insulation film 2 or the Al electrode 3.

Moreover, there is a probability that the depth of the pn junction plane is changed in accordance with the dispersion of the impurity diffusion (e.g., boron) as the impurity constituting the p-type semiconductor layer 4, resulting in occurrence of the dispersion in the relative distance from the pn junction plane to the defect layer.

Figure 2A:
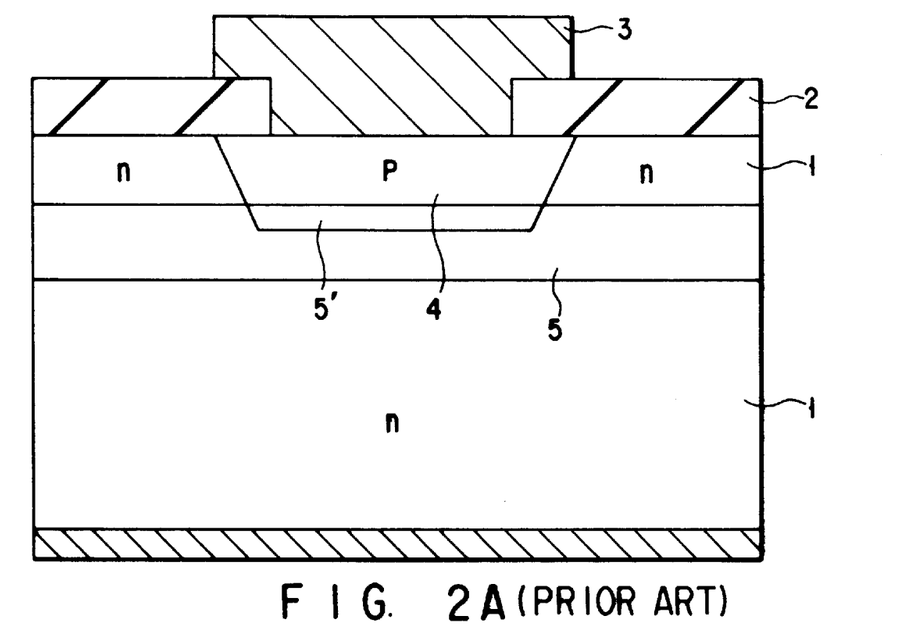
FIGS. 2A and 2B are schematic cross sectional views of another conventional semiconductor devices, illustrating those structures.
Figure 2B:
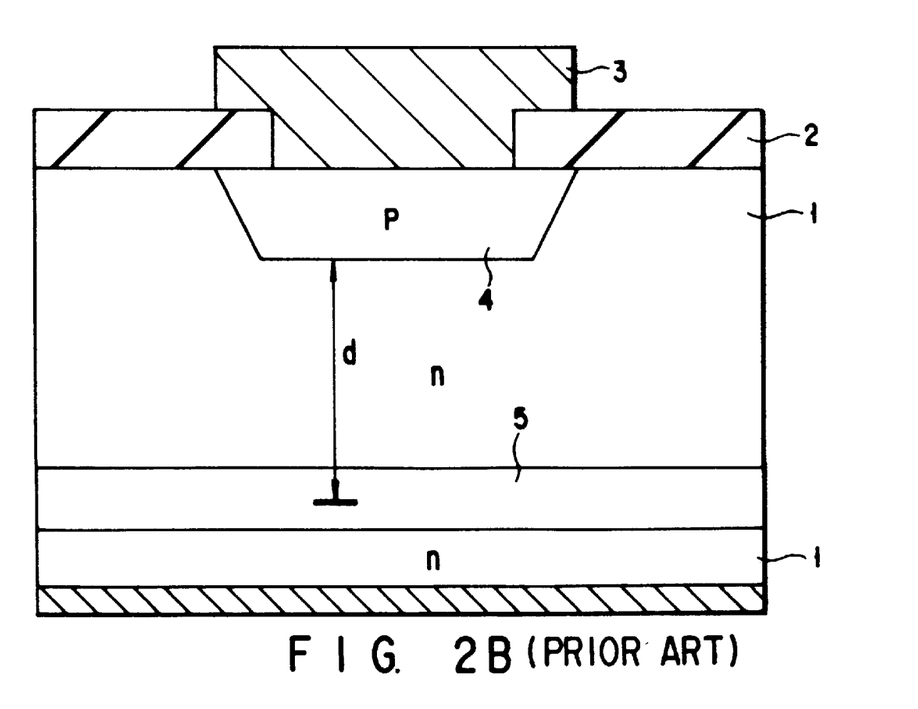

As described above, in the conventional semiconductor device and the method of manufacturing the same, the relative distance from the pn junction plane to the defect layer 5 is dispersed even when the depth of the emitted protons is uniform, with the result that the structure shown in FIGS. 2A and 2B is produced and its switching performance is dispersed.

FIG. 2A shows the case where the defect layer 5 overlaps the p-type semiconductor layer 4. With this structure, the region of the defect layer 5' overlapping the p-type semiconductor layer 4 does not contribute to the shortening of lifetime, resulting in lowered switching performance. Also, the degree of lowering of the switching performance is dispersed because the volume of the overlapping region 5' is changed.

FIG. 2B shows the case where the defect layer 5 is considerably apart from the pn junction plane. With this structure, particularly, in the case where a distance d from the defect layer 5 to the pn junction plane is larger than that of a carrier diffusion, the lifetime of the carrier injected from the p-type semiconductor layer 4 cannot be shortened by the defect layer 5, resulting in lowered switching performance.

Figure 6:
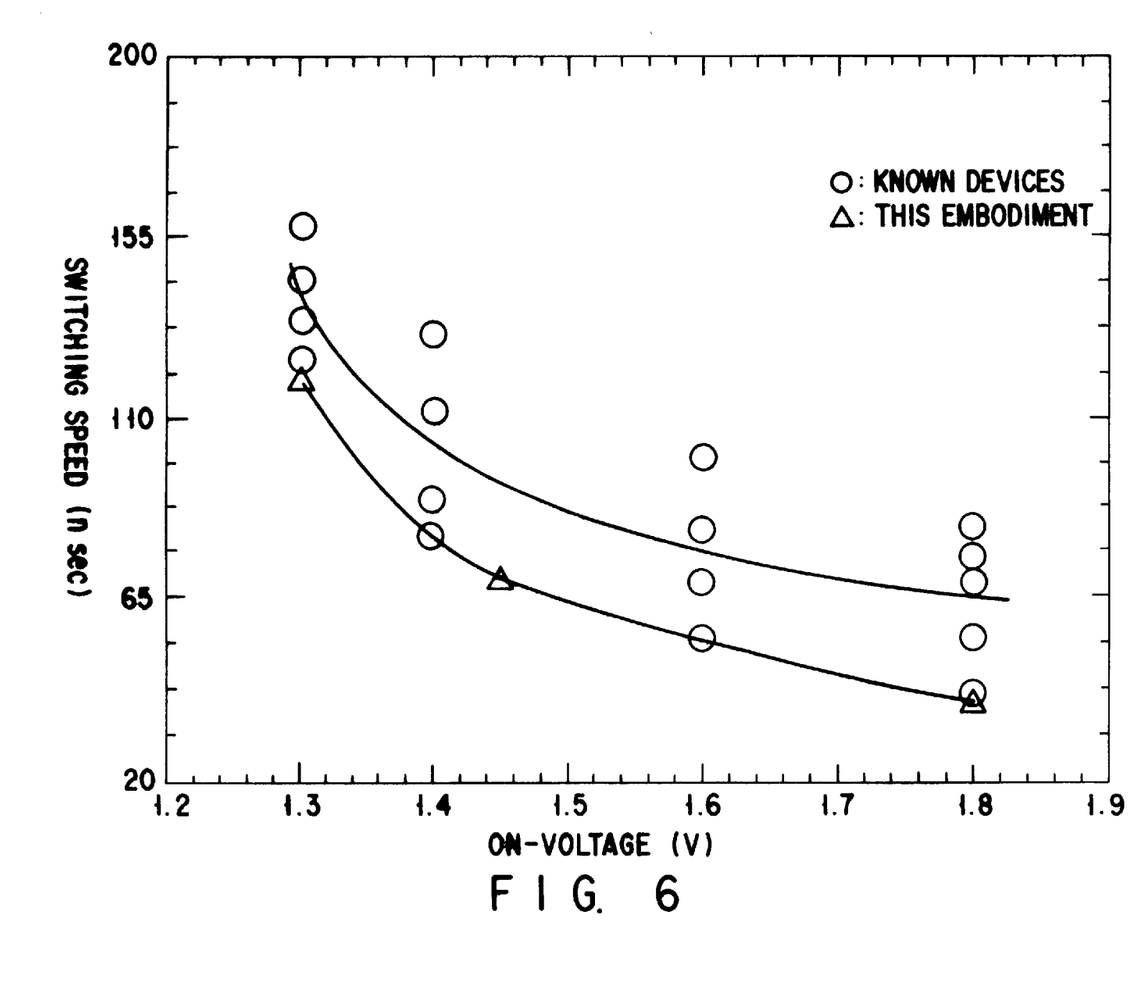
FIG. 6 is a graph illustrating the switching performance of a semiconductor device according to the present invention and that of a conventional semiconductor device.

FIG. 6 shows the relationship between on-voltage and switching speed in the semiconductor device. The semiconductor shows its superior performance at a higher switching speed and at a lowered on-voltage. Regarding a conventional semiconductor device, however, the switching speed is dispersed with respect to on-voltage.

Figure 3:
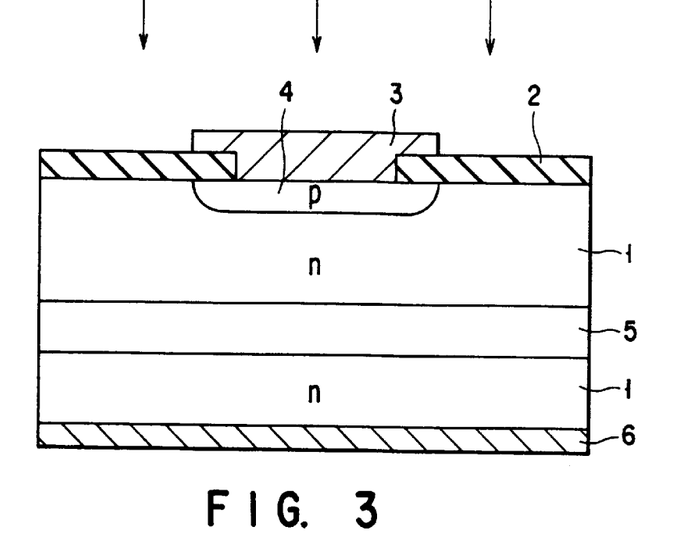
FIG. 3 is a schematic cross sectional view of another conventional semiconductor device, illustrating its structure.

Meanwhile, in the semiconductor devices as shown in FIG. 3, a defect layer 5 is formed to cover the entire transversal area of the n-type semiconductor substrate 1. Thus, all the electric current flowing from the electrode 3 to the electrode 6 pass through the defect layer 5 when the semiconductor device is on. The carriers passing through the defect layer 5 can be captured by the recombination centers and easily annihilated. The mobility of carriers is reduced in the defect layer 5 as they become scattered by the defects there. Due to these reasons, the defect layer 5 becomes a high resistance region in the semiconductor substrate 1 to give rise to a problem of raising the on-voltage of the semiconductor device.

BRIEF SUMMARY OF THE INVENTION

Accordingly, it is an object of the present invention to provide a semiconductor device capable of enhancing the yield rate in manufacturing of the semiconductor device with keeping the higher switching performance, by implementing a structure suppressing the dispersion of characteristics of the device.

It is another object of the present invention to provide a semiconductor device capable of performing higher speed switching operations without raising the on-voltage of the device, by implementing a structure adjusting the carrier lifetime, and a method of manufacturing such a semiconductor device.

According to an aspect of the present invention, there is provided a semiconductor device comprising: a first semiconductor layer of a first conductivity type; a second semiconductor layer of a second conductivity type formed to produce a junction plane with the first semiconductor layer; a first electrode facing the junction plane with the first semiconductor layer disposed therebetween; a second electrode facing the junction plane with the second semiconductor layer disposed therebetween; and a defect layer in the second semiconductor layer, wherein a distance from the junction plane to a peak point exhibiting the largest number of defects in the junction plane is between 10 $\mu$m and 40 $\mu$m.

According to another aspect of the present invention, there is provided a semiconductor device comprising: a first semiconductor layer of a first conductivity type; a second semiconductor layer of a second conductivity type formed to produce a junction plane with the first semiconductor layer; a first electrode facing the junction plane with the first semiconductor layer disposed therebetween; a second electrode facing the junction plane with the second semiconductor layer disposed therebetween; and a plurality of defect layers separated from one another in the first or second semiconductor layer, wherein a distance separating any adjacent ones of the defect layers is kept such that they are prevented from contacting each other and those regions having effect of shortening a carrier lifetime overlap each other.

In this device, the distance separating any adjacent ones of the defect layers may be between 10 $\mu$m and 80 $\mu$m. The position where the largest number of defects are found in each one of the plurality of defect layers may be located on a same single plane. Alternatively, the position where the largest numbers of defects are found in each one of the plurality of defect layers may be located on different planes.

According to another aspect of the present invention, there is provided a semiconductor device comprising: a first semiconductor layer of a first conductivity type; a second semiconductor layer of a second conductivity type formed to produce a junction plane with the first semiconductor layer; a first electrode facing the junction plane with the first semiconductor layer disposed therebetween; a second electrode facing the junction plane with the second semiconductor layer disposed therebetween; and a plurality of defect layers separated from one another in the first or second semiconductor layer, wherein a distance separating any adjacent ones of the defect layers is not greater than twice of a carrier diffusion length in the second semiconductor layer.

According to another aspect of the present invention, there is provided a semiconductor device comprising: a first semiconductor layer of a first conductivity type; a second semiconductor layer of a second conductivity type formed to produce a junction plane with the first semiconductor layer; a first electrode facing the junction plane with the first semiconductor layer disposed therebetween; a second electrode facing the junction plane with the second semiconductor layer disposed therebetween; and a defect layer in the second semiconductor layer, wherein a distance from each edge of the defect layer to a corresponding one of edges of the first semiconductor layer is greater than a carrier diffusion length in the second semiconductor layer.

According to another aspect of the present invention, there is provided a method of manufacturing a semiconductor device comprising the steps of: forming a first semiconductor layer of a first conductivity type and a second semiconductor layer of a second conductivity type to produce a junction plane therebetween; forming a first electrode facing the junction plane with the first semiconductor layer disposed therebetween and a second electrode facing the junction plane with the second semiconductor layer disposed therebetween; and forming a defect layer by irradiating part of the second semiconductor layer with charged particles such that a distance from the junction plane to a peak point exhibiting the largest number of defects in the junction plane is between 10 $\mu$m and 40 $\mu$m.

According to another aspect of the present invention, there is provided a method of manufacturing a semiconductor device comprising the steps of: forming a first semiconductor layer of a first conductivity type and a second semiconductor layer of a second conductivity type to produce a junction plane therebetween; forming a first electrode facing the junction plane with the first semiconductor layer disposed therebetween and a second electrode facing the junction plane with the second semiconductor layer disposed therebetween; and forming a plurality of defect layers separated from one another by irradiating part of the first or second semiconductor layer with charged particles such that a distance separating any adjacent ones of the defect layers is kept such that they are prevented from contacting each other and those regions having effect of shortening a carrier lifetime overlap each other.

In this method, the charged particles may be emitted such that the distance separating any adjacent ones of the defect layers is between 10 $\mu$m and 80 $\mu$m. The charged particles may be emitted such that the acceleration energy of charged particles changes in the plane of irradiation. In this case, the charged particles may be emitted by way of a mask having a plurality of regions with different thicknesses.

According to another aspect of the present invention, there is provided a method of manufacturing a semiconductor device comprising the steps of: forming a first semiconductor layer of a first conductivity type and a second semiconductor layer of a second conductivity type to produce a junction plane therebetween; forming a first electrode facing the junction plane with the first semiconductor layer disposed therebetween and a second electrode facing the junction plane with the second semiconductor layer disposed therebetween; and forming a plurality of defect layers separated from one another by irradiating part of the first or second semiconductor layer with charged particles such that a distance separating any adjacent ones of the defect layers is not greater than twice of a carrier diffusion length in the second semiconductor layer.

According to another aspect of the present invention, there is provided a method of manufacturing a semiconductor device comprising the steps of: forming a first semiconductor layer of a first conductivity type and a second semiconductor layer of a second conductivity type to produce a junction plane therebetween; forming a first electrode facing the junction plane with the first semiconductor layer disposed therebetween and a second electrode facing the junction plane with the second semiconductor layer disposed therebetween; and forming a defect layer by irradiating part of the second semiconductor layer with charged particles such that a distance from each edge of the defect layer to a corresponding one of edges of the first semiconductor layer is greater than a carrier diffusion length in the second semiconductor layer.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the present invention and, together with the general description given above and the detailed description of the preferred embodiments given below, serve to explain the principles of the present invention in which.

DETAILED DESCRIPTION OF THE INVENTION

Preferred embodiments of the present invention will now be described with reference to the accompanying drawings. The components same as those of the conventional device are respectively denoted by the same reference symbols and will not be described any further.

First Embodiment

Figure 4:
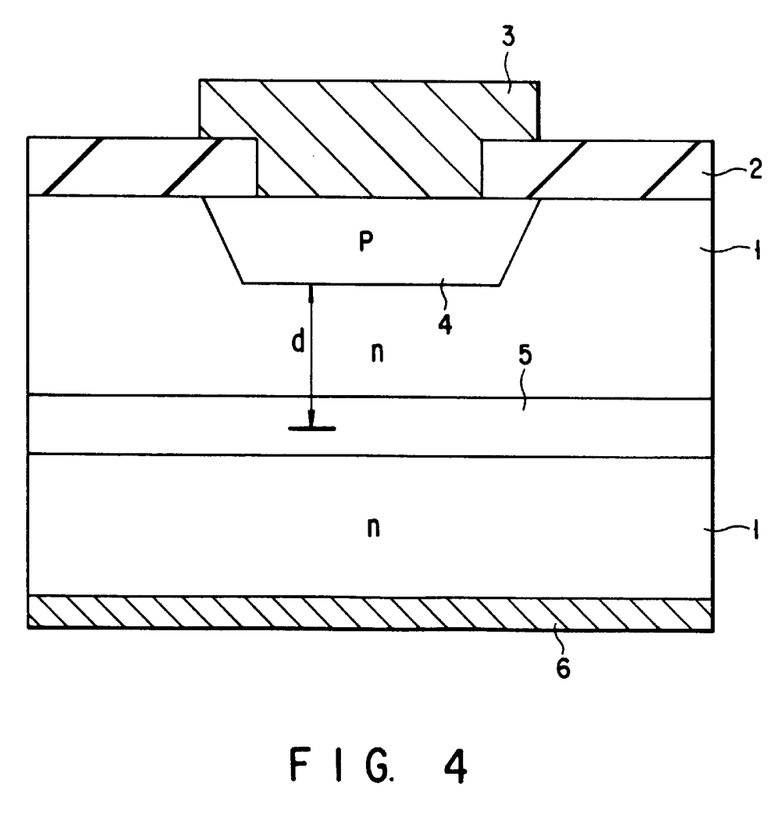
FIG. 4 is a schematic cross sectional view of a first embodiment of the present invention, illustrating its structure.

FIG. 4 is a schematic cross sectional view of a first embodiment of the present invention, illustrating its structure.

Like the conventional semiconductor device of FIG. 1, a p-type semiconductor layer 4 is formed in part of a n-type semiconductor substrate 1. Further, an interlayer insulation film 2 and an aluminum (Al) electrode 3 connecting with the p-type semiconductor layer 4 are formed in part of the n-type semiconductor substrate 1. An Al electrode 6 is formed on a reverse side of the n-type semiconductor substrate 1.

Unlike the conventional semiconductor device in which the defect layer 5 is formed directly under a junction plane connecting the p-type semiconductor layer 4 and the n-type semiconductor layer 1 such that it contacts with the p-type semiconductor layer 4, the defect layer 5 according to this embodiment is formed in the n-type semiconductor device 1 such that it is apart from the p-type semiconductor layer 4. In this case, a distance d from the pn junction plane to the defect layer 5 is between 10 μm and 40 μm, for example.

It is known that a HWHM is approximately 5 μm and a distance from a peak point exhibiting the largest number of defects in the defect layer to a tail thereof is approximately 10 μm. Thus, it is possible to prevent the defect layer 5 from overlapping the p-type semiconductor layer 4 by setting the position of the peak point in the defect layer 5 from the pn junction plane by a distance of over 10 μm.

As described above, the region where the defect layer 5 overlaps the p-type semiconductor layer 4 does not contribute to the shortening of lifetime of carriers. For this reason, according to this embodiment, the distance from the peak point in the defect layer 5 to the pn junction plane is selected to be larger than the distance from the defect layer 5 to the tail thereof, thereby preventing the defect layer 5 from overlapping the p-type semiconductor layer 4, with the result that the carrier lifetime can be effectively shortened by the defect layer 5.

Moreover, in a conventional semiconductor device, the defect layer 5 has been formed so as to contact with the pn junction plane by selecting the distance from the peak point in the defect layer 5 to the pn junction plane to be approximately 5 μm corresponding to the HWHM of the defect layer. For this reason, the distance from the defect layer 5 to the pn junction varies in accordance with the variation of process. Thus, there has been a probability that the region where the defect layer 5 overlaps the p-type semiconductor layer 4 is considerably dispersed. In contrast to this conventional semiconductor device, according to the present embodiment, the distance from the defect layer 5 to the pn junction plane is larger than the distance from the peak point in the defect layer 5 to the tail thereof, in which the distance of over 10 μm larger than twice of the HWHM is selected, for example. On the other hand, the dispersion of the distance from the defect layer 5 to the pn junction, which is due to the variation of process, is between 1 to 2 μm, so that there is no probability that the defect layer 5 overlaps the p-type semiconductor layer 4. Even if there occurs the overlapping, there is no probability that the volume of the overlapping region considerably changes. Therefore, it is possible to suppress the dispersion of the switching performance due to the dispersion of process.

As will be described in greater detail hereinafter by referring to FIG. 5, each of the peak points of the defect layer 5 has the effect of shortening the carrier lifetime within areas extending from it in two opposite directions by 40 μm each or by 80 μm in total. Therefore, carriers injected into or stored in areas where no defect layers 5 are formed can be securely recombined by the defect layer 5 by selecting the distance from the defect layer 5 to the pn junction plane to be shorter than 40 μm.

Moreover, since the defect layer 5 may be formed such that the distance from the peak point in the defect layer 5 to the pn junction plane is between 10 μm and 40 μm as described above, the margin come to considerably extend as compared with the case of the conventional semiconductor device in which the defect layer 5 has been formed to contact to the pn junction plane.

Figure 5:
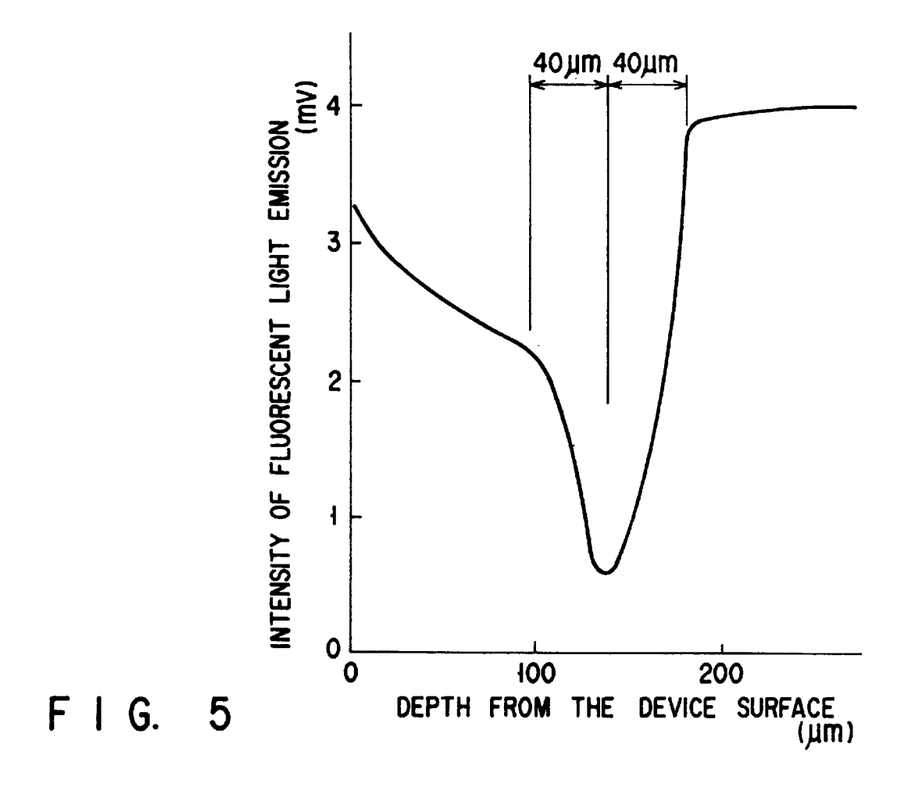
FIG. 5 is a graph illustrating some of the data that support the present invention.

FIG. 5 is a graph illustrating the intensity distribution of the fluorescent light generated by recombined carriers with respect to the depth of the substrate. The n-type semiconductor substrate 1 where a defect layer 5 has been formed by the irradiation with protons, is irradiated with a laser beam having a diameter of about 1 μm, thereby producing electrons and holes. Fluorescent light appears when holes that are minor carriers are diffused and electrons that are major carriers are recombined. The graph of FIG. 5 is obtained by observing the intensity of fluorescence of the device, shifting the spot of laser beam irradiation.

When electrons and holes are directly recombined, the emitted fluorescent light has a specific wavelength defined by the band gap of the semiconductor. However, light or heat having a wavelength greater than fluorescent light will be generated when holes that are minor carriers are captured by the recombination centers formed in the band gap by defects. Therefore, with an observation system for observing fluorescent light having the specific wavelength, only fluorescent light will be observed when electrons and holes are directly combined and the intensity of the observed light will be reduced when holes are captured by the recombination centers.

Thus, the zones where the intensity of fluorescent light is low in FIG. 5 will safely be assumed to be areas where the lifetime of holes is shortened. More specifically, it will be realized that the areas are those extending from each and every peak point of the defect layer in two opposite directions by 40 μm each or by 80 μm in total.

Therefore, the lifetime of the carriers injected from the p-type semiconductor layer 4 to the n-type semiconductor layer 1 can be shortened by setting the peak point of the defect layer 5 at 40 μm depth from the pn junction plane.

A semiconductor having the above described structure can be manufactured by adopting an ordinary method, e.g., by irradiating with protons at a dose of 5 to $50 \times 10^{11}$ cm$^{-2}$ onto the n-type semiconductor layer 1 on which the p-type semiconductor layer 4 and forming the interlayer insulation film 2. In the case where the depth of the junction plane connecting the p-type semiconductor layer 4 and the n-type semiconductor layer 1 is approximately 10 μm, for example, the defect layer 5 can be formed at a position of approximately 50 μm depth by irradiating with protons with an acceleration energy level of 2.1 MeV. In such a manner, the structure in which the distance from the pn junction to the defect layer 5 is approximately 40 μm is realized.

Also note that, while the irradiation with protons is executed to produce defect layers 5 in the above embodiment, they may be replaced by other charged particles such as those of $^3$He, $^4$He or $^2$H, although the use of lightweight particles such as protons is advantageous in that the acceleration energy required for injecting particles down to a desired depth can be reduced and the defect layers can be made to show desired respective profiles.

Although this embodiment shows the case where the defect layer 5 is formed in the n-type semiconductor 1, similar advantages are obtained in the case where the defect layer 5 is formed in the p-type semiconductor 4.

FIG. 6 is a graph illustrating the switching performance of a semiconductor device according to the present invention and that of a conventional semiconductor device. According to the present invention, the dispersion of switching performance can be considerably suppressed without lowering the switching performance, as compared with the conventional semiconductor device. Accordingly, the semiconductor device and method of manufacturing the same according to the present invention enhance the yield rate in manufacturing of the semiconductor device.

As described above in detail, with the semiconductor device and method of manufacturing the same according to the present invention, the yield rate in manufacturing of the semiconductor device can be enhanced with keeping the higher switching performance, by implementing the structure suppressing the dispersion of characteristics of the device.

Second Embodiment

Figure 7:
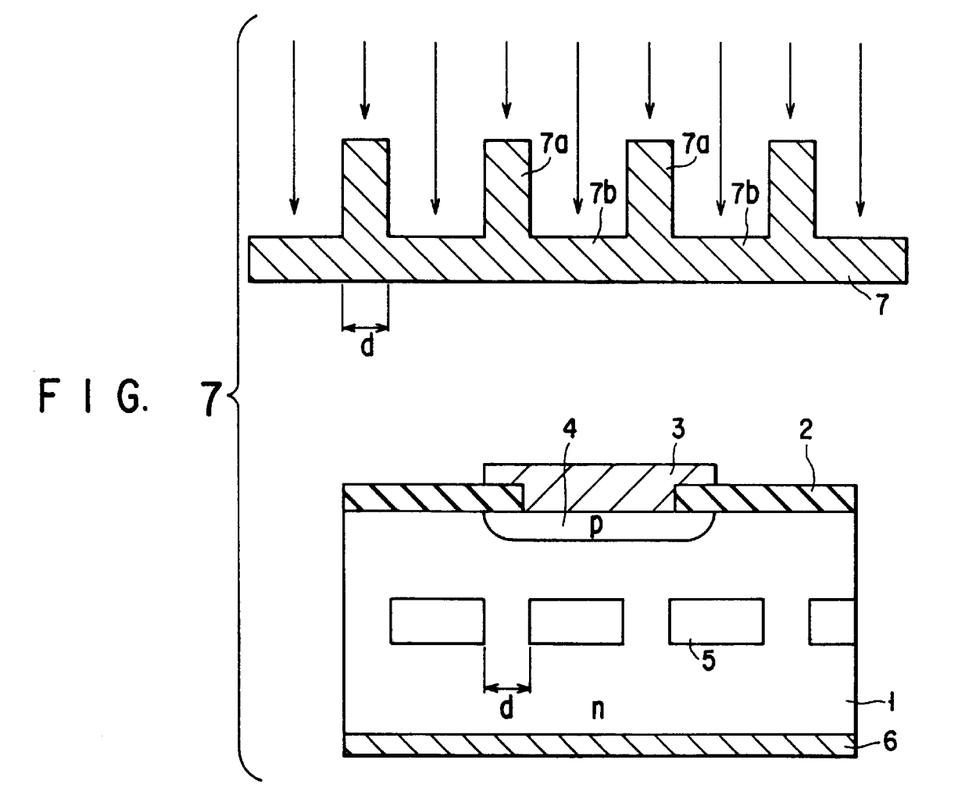
FIG. 7 is a schematic cross sectional view of a second embodiment of the present invention, illustrating its structure.
Figure 8:
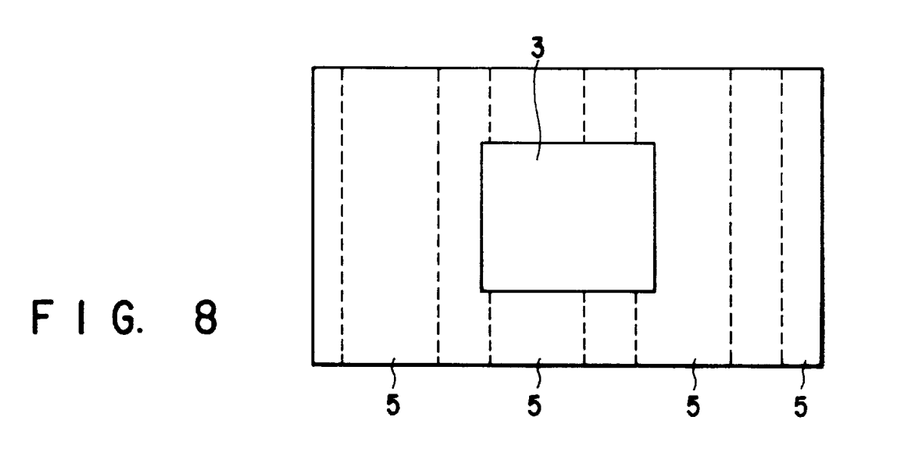
FIG. 8 is a plan view of the embodiment of FIG. 7 that is unmasked.

FIG. 7 is a schematic cross sectional view of a second embodiment of the present invention, illustrating its structure. FIG. 8 is a plan view of the embodiment of FIG. 7 that is unmasked.

Like the conventional semiconductor device of FIG. 3, a semiconductor device according to this embodiment comprises an n-type semiconductor substrate 1, a p-type semiconductor layer 4 formed in part of the substrate 1, an electrode 3 connected to the p-type semiconductor layer 4 and an electrode 6 formed on the rear surface of the semiconductor substrate 1. While it also comprises a defect layer 5 formed in the n-type semiconductor substrate 1 as in the case of the conventional semiconductor device, it is in fact divided into a plurality of defect layers unlike its counterpart of the conventional device that is formed on an entire transversal plane of the device. Any adjacently located defect layers are separated from one another by a distance d between 10 μm and 80 μm.

Generally, when a defect layer 5 is formed by irradiating a semiconductor device with protons, the point exhibiting the largest number of defects (hereinafter referred to as the peak point) is located where protons are stopped and accompanied by outskirts extending in two opposite directions by about 5 μm each. Thus, any two adjacently located defect layers 5 are prevented from contacting each other when they are separated by a distance not less than 10 μm.

As will be described in greater detail hereinafter by referring to FIG. 5, each of the peak points of the defect layer 5 has the effect of shortening the carrier lifetime within areas extending from it in two opposite directions by 40 μm each or by 80 μm in total. Therefore, carriers injected into or stored in areas where no defect layers 5 are formed can be securely recombined by the defect layers by separating any two adjacently located peak points by a distance not greater than 80 μm.

FIG. 5 is a graph illustrating the intensity distribution of the fluorescent light generated by recombined carriers with respect to the depth of the substrate. The n-type semiconductor substrate 1 where a defect layer 5 has been formed by the irradiation with protons, is irradiated with a laser beam having a diameter of about 1 μm, thereby producing electrons and holes. Fluorescent light appears when holes that are minor carriers are diffused and electrons that are major carriers are recombined. The graph of FIG. 5 is obtained by observing the intensity of fluorescence of the device, shifting the spot of laser beam irradiation.

When electrons and holes are directly recombined, the emitted fluorescent light has a specific wavelength defined by the band gap of the semiconductor. However, light or heat having a wavelength greater than fluorescent light will be generated when holes that are minor carriers are captured by the recombination centers formed in the band gap by defects. Therefore, with an observation system for observing fluorescent light having the specific wavelength, only fluorescent light will be observed when electrons and holes are directly combined and the intensity of the observed light will be reduced when holes are captured by the recombination centers.

Thus, the zones where the intensity of fluorescent light is low in FIG. 5 will safely be assumed to be areas where the lifetime of holes is shortened. More specifically, it will be realized that the areas are those extending from each and every peak point of the defect layer in two opposite directions by 40 μm each or by 80 μm in total.

Therefore, the lifetime of carriers injected or stored in the n-type semiconductor substrate 1 can be shortened when the distance separating any adjacent ones of the defect layers is not greater than 80 μm.

Now, a method of manufacturing a semiconductor device having the above described configuration according to the present invention will be described.

Firstly, a p-type semiconductor layer 4, an interlayer insulation film 2 and aluminum (Al) electrodes 3 and 6 are formed on an n-type semiconductor substrate 1 by means of a known technique.

Then, protons will be emitted onto the device from above at a dose of 5 to $50 \times 10^{11}$ cm$^{-2}$, using an aluminum (Al) mask arranged above the semiconductor substrate as shown in FIG. 7. The Al mask is divided into regions of two different types. The first type regions 7a may have a thickness of 200 μm, whereas the thickness of the second type regions 7b may be 50 μm. If protons are emitted with an acceleration energy level of 3 MeV, those hitting the first regions 7a will be stopped by the Al mask, whereas those hitting the second regions 7b will pass through the mask 7 and be stopped at a level in the semiconductor substrate 1 that may typically have a depth of 40 μm.

Thus, when each of the first regions 7a is made to have a width between 10 μm and 80 μm, any adjacent defect layers will be separated from one another by a distance between 10 μm and 80 μm. Now, a semiconductor device having the above described configuration is prepared.

Note that the semiconductor device according to this embodiment is characterized in that the defect layers 5 are separated from one another and held in contact with a region where the carrier lifetime is shortened.

Since comparable conventional devices comprises a defect layer 5 covering the entire transversal area of the n-type semiconductor substrate 1, all the carriers participating in the electric current flowing through the device in an on-state pass through the defect layer 5 that is a high resistance area of the device. To the contrary, since the above embodiment of semiconductor device according to the present invention comprises defect layers that are separated from one another, only part of the carriers participating in the electronic current flowing through the device pass through defect layer 5 and the rest of them pass through low resistance areas of the device where defect layers 5 do not exist. Thus, consequently the on-voltage of the device can be significantly reduced.

It should be emphasized here again that the carrier lifetime can be shortened in areas where the defect layers 5 do not exist when they are located within 40 μm from nearby peak points. Thus, the carriers injected into or stored in the semiconductor substrate 1 in an off-state can be swiftly annihilated to shorten the time required for turning off the device when the distance separating any adjacent defect layers 5 does not exceed 80 μm.

The carriers injected into or stored in the defect layer substrate 1 are diffused randomly in an off-state because there is no electric field existing in that state and, therefore, the carriers located among the defect layers but not within them are captured and annihilated by the recombination centers in the nearby defect layers. In an on-state, on the other hand, an electric field appears in the semiconductor substrate 1 because of the voltage applied to the electrodes 3 and 6 and carriers move with respect to this electric field so that the carriers located among the defect layers but not within them are moved to reduce the probability with which they are respectively attracted toward the nearby defect layers and captured by the recombination centers.

Generally, when high resistance areas and low resistance areas are arranged in parallel between the electrodes, an electric current flows through the low resistance areas rather than through the high resistance areas. It will be noted that the semiconductor device according to this embodiment has both high resistance areas where defect layers are formed and low resistance areas where defect layers are not formed, which are arranged practically in parallel between the electrodes so that consequently an electric current flows through areas where defect layers 5 are not formed to reduce the probability with which the carriers participating in the electric current are captured by the recombination centers in the defect layers.

Thus, the above described semiconductor device according to this embodiment can shorten the time required for turning off by capturing carriers in an off-state and also the on-voltage by reducing the probability with which carriers are captured in an on-state as a result of forming defect layers 5 separated from one another.

Third Embodiment

Figure 9:
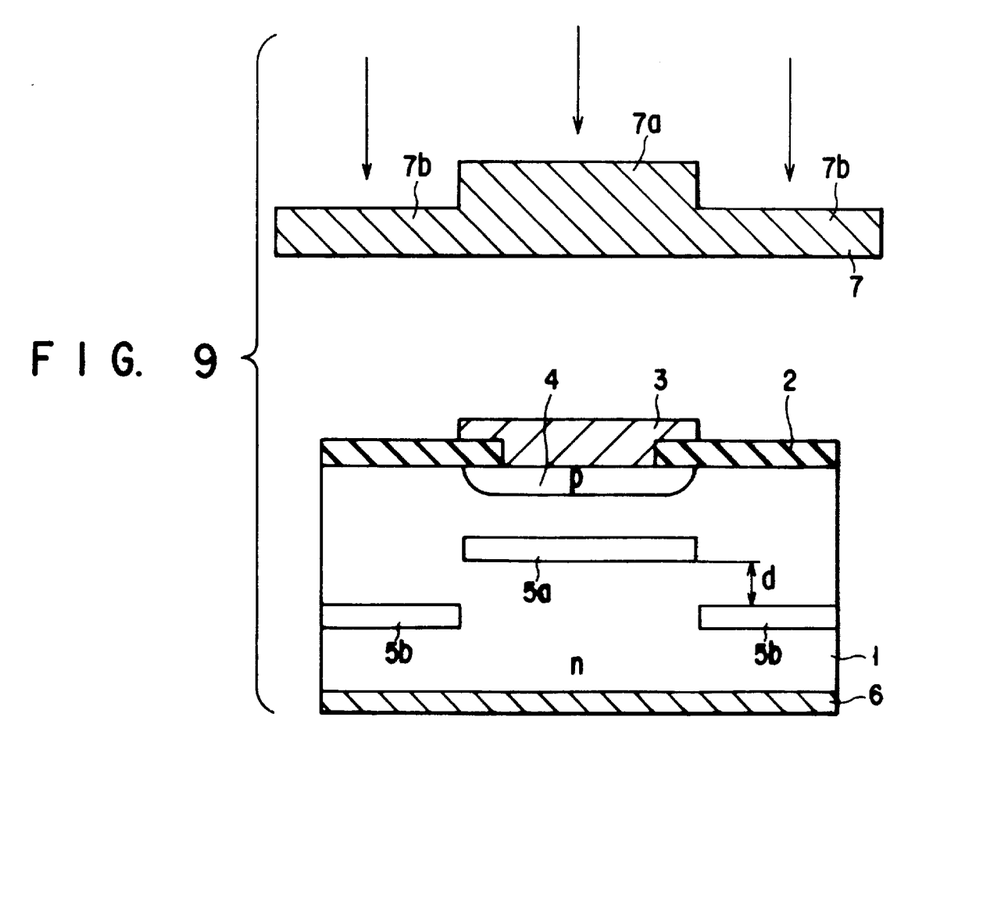
FIG. 9 is a schematic cross sectional view of a third embodiment of the present invention, illustrating its structure.
Figure 10:
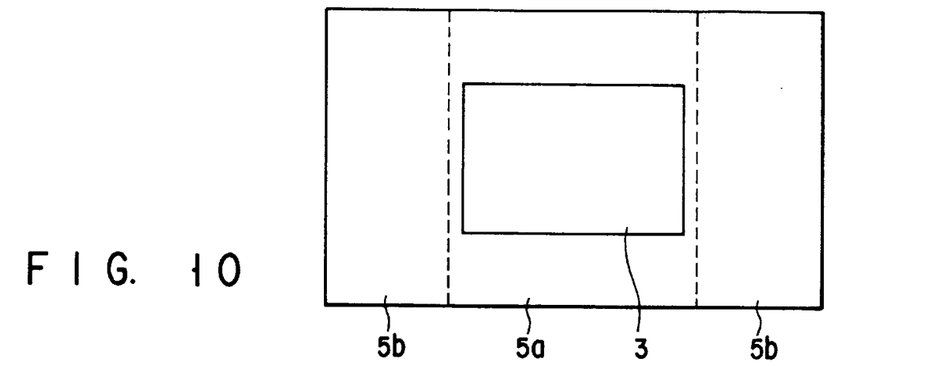
FIG. 10 is a plan view of the embodiment of FIG. 9 that is unmasked.

Next, a third embodiment of a semiconductor device according to the present invention will be described by referring to FIG. 9.

Like the above described second embodiment, the semiconductor device according to this embodiment comprises an n-type semiconductor substrate 1, a p-type semiconductor layer 4 formed in part of the substrate 1, an electrode 3 connected to the p-type semiconductor layer 4 and an electrode 6 formed on the rear surface of the semiconductor substrate 1. While it also comprises defect layers 5 formed in the n-type semiconductor substrate 1 as in the case of the second embodiment, it is in fact divided into a plurality of defect layers that are arranged in different levels. For instance, a group of defect layers, or defect layers 5a, are arranged at a relatively low level, whereas another group of defect layers, or defect layers 5b, are arranged at a relatively high level, although both the defect layers 5a and the defect layers 5b do not entirely occupy respective planes but are formed only in part of the respective planes. The vertical distance d separating the level of the defect layers 5a and that of the defect layers 5b is between 10 $\mu$m and 80 $\mu$m.

Since the defect layers 5a are separated from the defect layers 5b by a distance not smaller than 50 $\mu$m in this embodiment, the on-voltage can be reduced for the reason same as the one described above by referring to the second embodiment. Similarly, since the distance separating the defect layers 5a and 5b is not greater than 80 $\mu$m, the carrier lifetime of the device and hence the time required for turning off the device can be shortened in an off-state.

In addition to the above pointed out advantages that are common to the second and third embodiments, the on-voltage of this embodiment can be further reduced by arranging the defect layers at levels that are effective to annihilate carriers in an off-state because the levels of the defect layers 5a and 5b can be appropriately selected.

For instance, the defect layers 5b that are formed at a relatively low level in the semiconductor substrate 1 can effectively capture the carriers stored in the semiconductor substrate 1, whereas the defect layers 5a that are formed at a relatively high level in the semiconductor substrate 1 can quickly annihilate the carriers injected into the semiconductor substrate 1 from the p-type semiconductor layer 4.

While the different effects are obtained only by arranging defect layers at a plurality of different levels, the defect layer of conventional devices is formed only at a single level and covers an entire plane at that level in the device so that the carriers participating in the electric current flowing through the device in an on-state pass through the defect layer to raise the on-voltage. On the other hand, since the defect layers of this embodiment are formed at a plurality of different levels and in areas occupying only part of the entire area of each of those levels, the electric current can flow through areas where defect layers do not exist to consequently make it possible to reduce the on-voltage. In other words, while the carrier lifetime of conventional semiconductor devices can be controlled only one-dimensionally with respect to the depth of the device, that of a semiconductor device according to the present invention can be controlled three-dimensionally.

Note that the performance of this embodiment can be improved by selecting a specific positional relationship between each of the defect layers and the semiconductor layers. For example, if appropriate, a single defect layer 5a may be arranged at a relatively high level and directly below the p-type semiconductor layer 4.

Now, a method of manufacturing a semiconductor device having the above described configuration according to the present invention will be described.

Firstly, a p-type semiconductor layer 4, an interlayer insulation film 2 and aluminum (Al) electrodes 3 and 6 are formed on an n-type semiconductor substrate 1 by means of a known technique and then protons will be emitted onto the device from above, using an Al mask arranged above the semiconductor substrate, as in the case of the second embodiment.

Note, however, that the Al mask has a profile different from that of the second embodiment and protons are emitted with an accelerating energy level also different from that of the second embodiment. More specifically, the Al mask 7 has a thickness of 105 $\mu$m for the first region 7a and a thickness of 65 $\mu$m for the second regions 7a. While the first regions of the mask have a width between 10 $\mu$m and 80 $\mu$m for the second embodiment, the first region of the mask may have any desired width for the third embodiment. Protons are emitted with an acceleration energy level of 4 MeV for this embodiment.

The first regions 7a of the Al mask used for the second embodiment have such a large thickness that no proton can pass through the regions 7a and therefore the emitted protons can pass through only the second regions to form defect layers 5 in the semiconductor substrate 1 of the second embodiment. To the contrary, the energy level for accelerating protons is raised and the first region of the Al mask is made to show a relatively small thickness for this embodiment so that protons can pass through the first regions 7a of the mask and form defect layers 5a in the semiconductor substrate 1 at a relatively high level that is about 40 $\mu$m deep from the surface. The protons passing through the second regions 7b of the mask form defect layers 5b in the semiconductor substrate 1 at a relatively low level that is about 80 $\mu$m deep from the surface. Thus, a plurality of groups of defect layers 5a and 5b are formed at different levels in the semiconductor substrate 1 with a single operation of the irradiation with protons, by using a mask having regions with different thicknesses and emitting protons with a high acceleration energy level.

Note that the thicknesses of the regions 7a, 7b of the mask and the acceleration energy level for emitting protons have to be selected appropriately to realize a distance between 10 $\mu$m and 80 $\mu$m separating any adjacent defect layers in the semiconductor substrate. Then, a semiconductor device having a reduced on-voltage and a short device turning-off time can easily be prepared.

Also note that, while protons are emitted to produce defect layers 5 in the above embodiment, they may be replaced by other charged particles such as those of $^3$He, $^4$He or $^2$H, although the use of lightweight particles such as protons is advantageous in that the acceleration energy required for injecting particles down to a desired depth can be reduced and the defect layers can be made to show desired respective profiles.

Although this embodiment shows the case where the defect layer 5 is formed in the n-type semiconductor 1, a similar advantages are obtained in the case where the defect layer 5 is formed in the p-type semiconductor 4.

Figure 11:
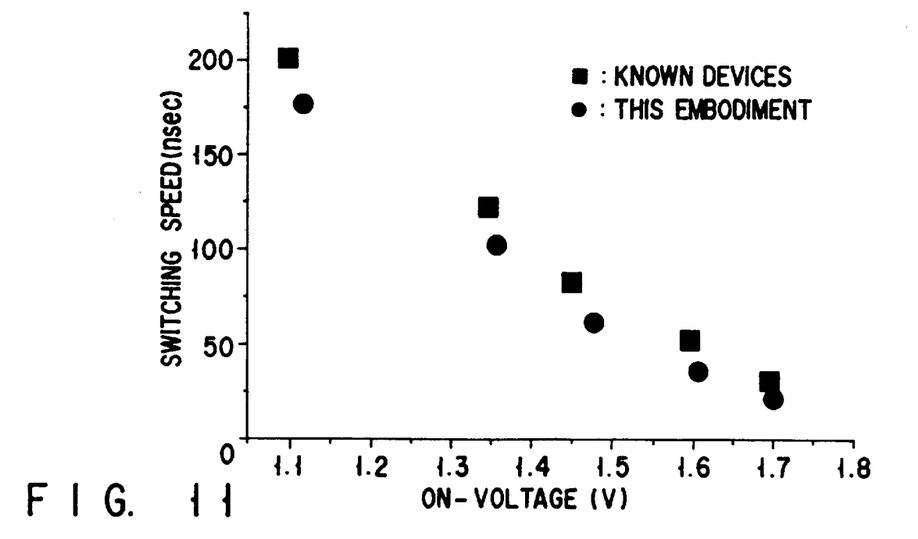
FIG. 11 is a graph illustrating the switching performance of a semiconductor device according to the present invention and that of a conventional semiconductor device.

FIG. 11 is a graph illustrating the switching performance of a semiconductor device according to the present invention and that of a conventional semiconductor device. It will be understood that a semiconductor device according to the present invention can effectively reduce the on-voltage to realize a quick switching performance of the device.

Fourth Embodiment

Figure 12:
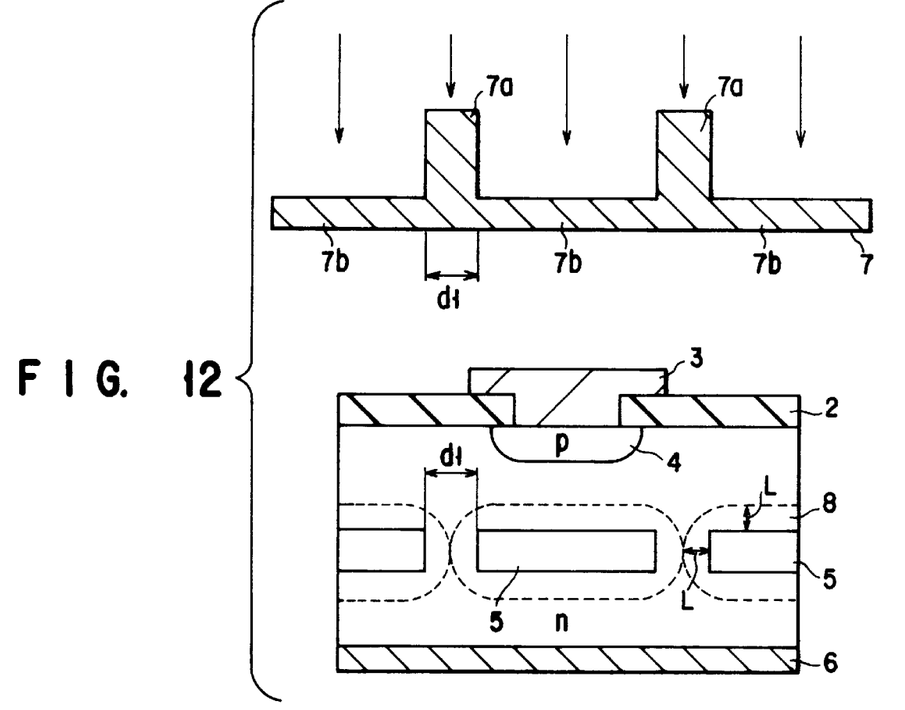
FIG. 12 is a schematic cross sectional view of a fourth embodiment of the present invention, illustrating its structure.
Figure 13:
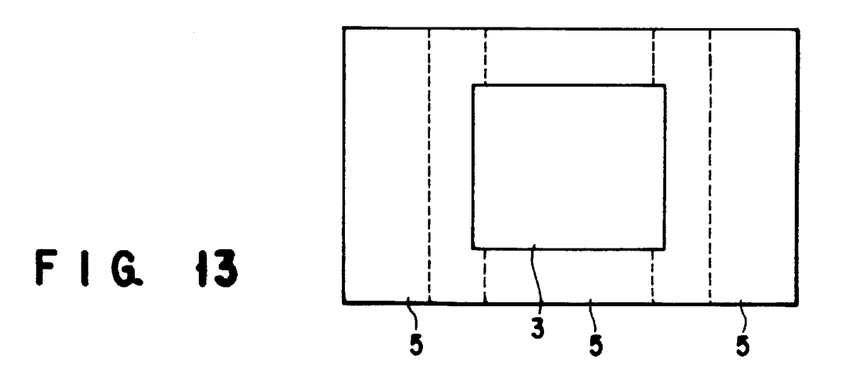
FIG. 13 is a plan view of the embodiment of FIG. 13 that is unmasked.

FIG. 12 is a schematic cross sectional view of a fourth embodiment of the present invention, illustrating its structure and FIG. 13 is a plan view of the embodiment of FIG. 13 that is unmasked.

In this embodiment, a p-type semiconductor region 4 is formed on part of the surface of an n-type semiconductor substrate 1.

A plurality of defect layers 5 are formed in the semiconductor substrate 1 at a same level with a given depth from the surface of the semiconductor substrate 1. Reference numeral 8 in FIG. 12 denotes a short lifetime layer, which is located within the diffusion length L of carriers from a corresponding one of the defect layers. The carrier diffusion length L in FIG. 12 refers to the diffusion length for carriers injected from the semiconductor region 4.

When no voltage is applied to the electrodes 3 and 6, most of the carriers located within the short lifetime layers 8 are diffused and get to the defect layers 5, where they are annihilated by recombination so that their lifetime is shorter than when they are found in an ordinary n-type semiconductor substrate.

Any adjacent ones of the defect layers 5 are separated by a distance d1 that is not greater than twice the carrier diffusion length L in the semiconductor substrate 1. When a p-type region is arranged on the surface of the n-type semiconductor substrate as shown in FIG. 12, the carrier diffusion length refers to the diffusion length of holes in the n-type semiconductor substrate 1.

If the carrier diffusion length is L and the diffusion coefficient is D while the carrier lifetime is τ, L is expressed by the root of the product of D and τ or equation below.

$$L=(D\times\tau)^{1/2}$$

The lifetime τ will be shortened and the diffusion length L will be increased if the impurity concentration of the n-type semiconductor substrate 1 is raised. On the other hand, the diffusion length L will be increased if the impurity concentration is reduced.

The embodiment of semiconductor device can be manufactured by a method as described earlier by referring to the second embodiment, although the width of the first region 7b of the Al mask is smaller than twice of the carrier diffusion length, which may typically be 150 μm, while the thickness of the first region 7b is made equal to 150 μm. Then, protons are emitted onto the semiconductor substrate with an acceleration voltage level of 1.5 MeV and a dose of $5\times10^{12}$ cm$^{-2}$, placing the Al mask between the proton emitting source and the semiconductor substrate. Protons pass through by about 30 μm in the Al when an acceleration voltage of 1.5 MeV is applied so that only the areas of the semiconductor substrate 1 located respectively below the thin regions 7b of the Al mask are irradiated with protons.

If the semiconductor device according to this embodiment is turned off from an on-state, the carriers injected from the p-type region, or holes, are diffused. The defect layers 5 capture most of the holes found in the low lifetime layers 8 to consequently shorten the time required for turning off the device. Additionally, since the defect layer 5 comprises regions where no defects exist, the probability with which carriers are captured is reduced to consequently reduce the on-voltage.

Figure 14:
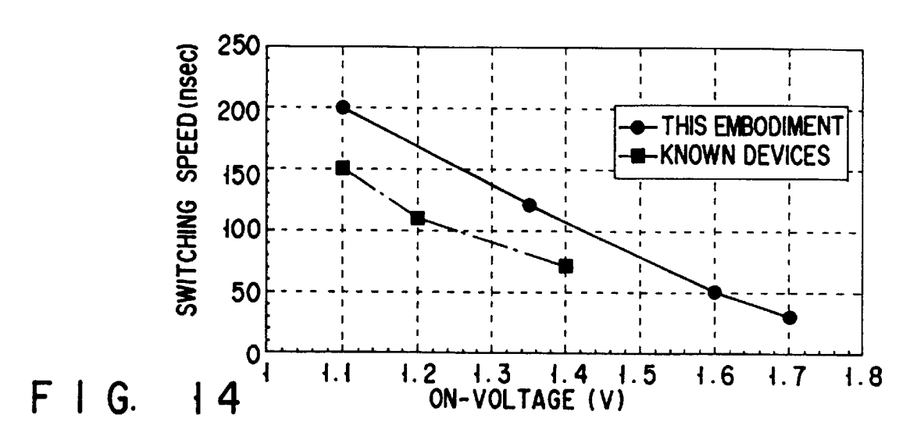
FIG. 14 is a graph illustrating the relationship between the on-voltage and the switching performance of the fourth embodiment of the present invention.

FIG. 14 is a graph illustrating the relationship between the on-voltage and the switching performance of the above described fourth embodiment of the present invention. As seen, the trade-off curve for the on-voltage and the switching speed can be significantly improved with this embodiment.

Fifth Embodiment

Figure 15:
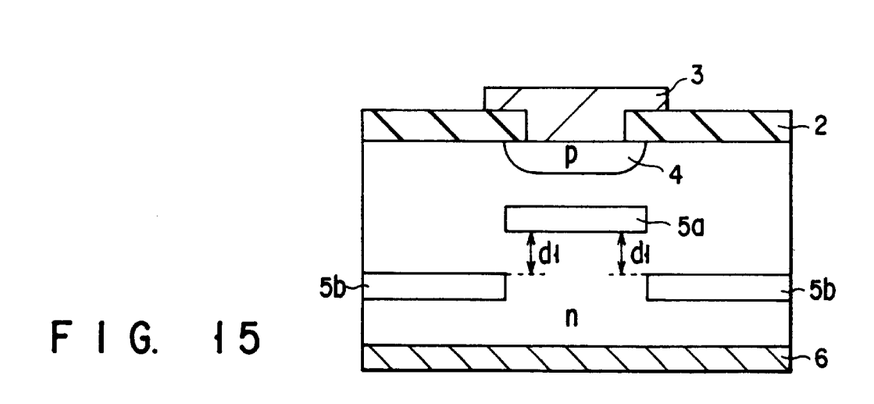
FIG. 15 is a schematic cross sectional view of a fifth embodiment of the present invention, illustrating its structure.

FIG. 15 is a schematic cross sectional view of a fifth embodiment of the present invention, illustrating its structure. This embodiment is similar to the third embodiment in terms of configuration and manufacturing method, although the vertical distance d1 separating the relatively low level where the defect layers 5b are formed and the relatively high level where the defect layer 5a is formed is made not greater than twice the carrier diffusion length L.

It will be appreciated that this embodiment is as effective as the above described fourth embodiment.

Sixth Embodiment

Figure 16:
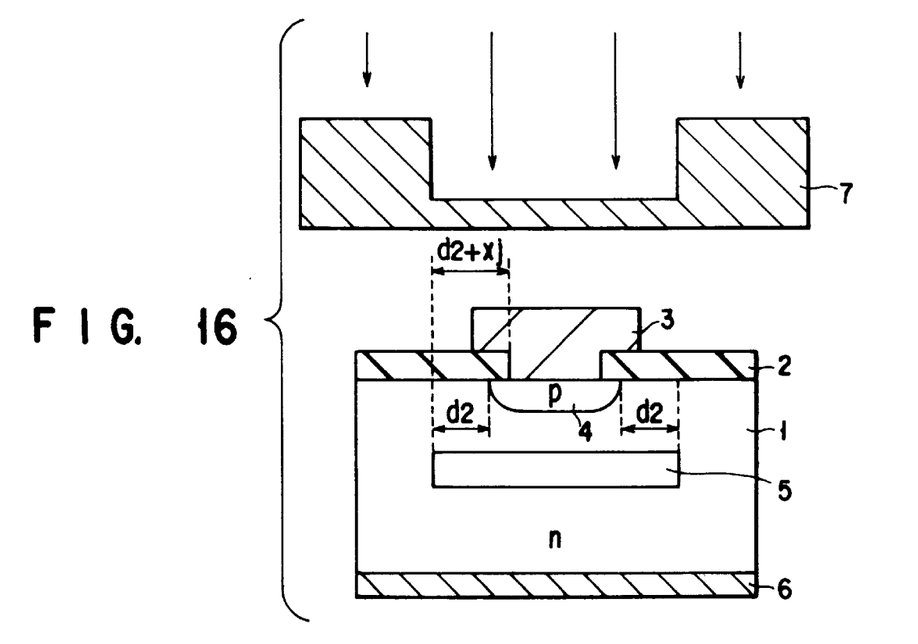
FIG. 16 is a schematic cross sectional view of a sixth embodiment of the present invention, illustrating its structure.
Figure 17:
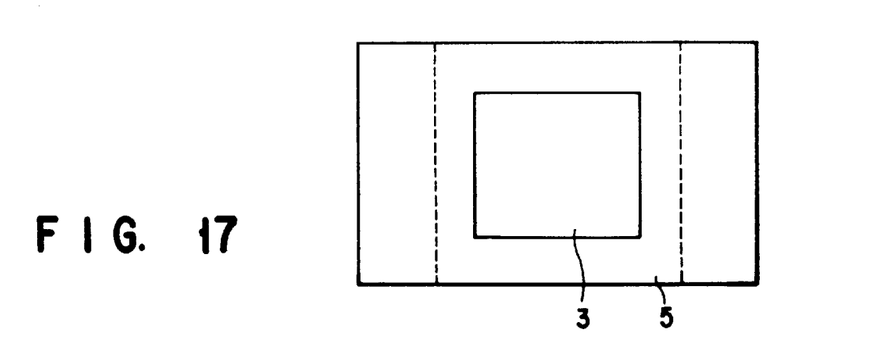
FIG. 17 is a plan view of the embodiment of FIG. 16 that is unmasked.

FIG. 16 is a schematic cross sectional view of a sixth embodiment of the present invention, illustrating its structure and the mask used for manufacturing the embodiment. FIG. 17 is a plan view of the embodiment of FIG. 16 that is unmasked.

A p-type semiconductor region 4 is formed on the surface of an n-type semiconductor substrate 1.

Unlike the preceding embodiments, a single undivided defect layer 5 is formed in this embodiment. Each of the edges of the defect layer 5 and the corresponding one of the edges of the p-type semiconductor region 4 are separated by a distance d2 greater than the carrier diffusion length. The carrier diffusion length as used for this embodiment has the same meaning as that of the carrier diffusion length of the fourth embodiment. Note that the defect layer 5 does not cover an entire plane in the semiconductor substrate 1.

If the p-type semiconductor region 4 is formed by diffusing an impurity substance from part of the semiconductor substrate, the distance from each of the edges of the mask used for the diffusing operation to the corresponding one of the edges of the defect layer 5 is not smaller than the sum of the depth of diffusion Xj of the impurity substance and the carrier diffusion length L. The mask used for forming the interlayer insulation film 2 may be used also for the diffusing operation.

The defect layer 5 is typically formed by using an aluminum mask having a thin region corresponding to the defect layer 5 and irradiating the semiconductor device with protons.

In this embodiment, the defect layer is formed only in a region that is separated from the pn junction plane substantially by the carrier diffusion length. With this arrangement, the carriers injected into the substrate can be effectively annihilated to raise the switching speed when the semiconductor device is turned off. On the other hand, the rise in the on-resistance can be minimized by minimizing the annihilation of carriers in the semiconductor substrate 1 when the semiconductor device is turned on.

Figure 18:
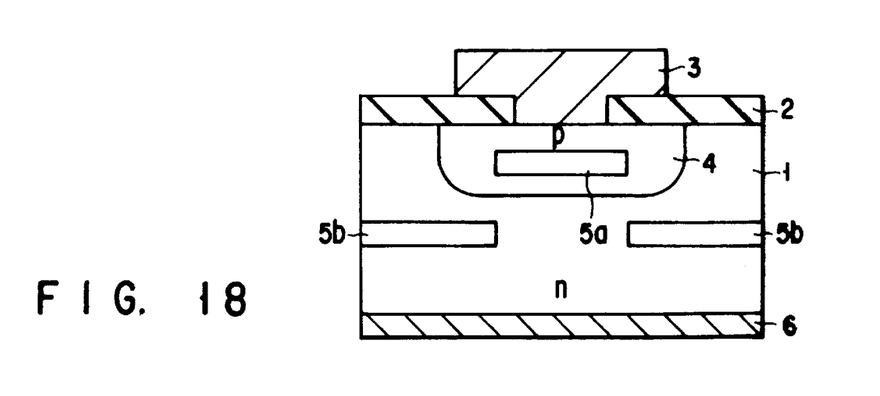
FIG. 18 is a schematic cross sectional view of a semiconductor device obtained by modifying the third embodiment and the fifth embodiment.

While the defect layer 5 is formed in the n-type semiconductor substrate 1 in any of the preceding embodiments, alternatively part of the defect layer 5 may be formed in the p-type semiconductor layer 4 as shown in FIG. 18 without damaging the advantages of the embodiments. Note that the semiconductor device illustrated in FIG. 18 can be obtained by modifying the third embodiment or the fifth embodiment.

While the mask 7 is made of aluminum in any of the above embodiments, the material to be used for the mask is not limited thereto. For instance, the mask may be made of Au, Ni, Si or V.

Again, while protons are emitted to produce a defect layer in any of the above embodiments, $^2$H, $^3$H, $^3$He or $^4$He may be used in place of protons.

As described above in detail, since a semiconductor device according to the present invention has a defect layer only in part of the semiconductor substrate, it has the advantages of a quick switching performance and a low on-voltage.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents.

We claim:

1. A semiconductor device comprising:

a first semiconductor layer of a first conductivity type;

a second semiconductor layer of a second conductivity type formed to produce a junction plane with said first semiconductor layer;

a first electrode facing said junction plane with said first semiconductor layer disposed therebetween:

a second electrode facing said junction plane with said second semiconductor layer disposed therebetween; and a plurality of defect layers separated from one another in one of said first and second semiconductor layer, wherein a distance separating any adjacent ones of said defect layers is between 10 µm and 80 µm such that they are prevented from contacting each other and areas of said defect layers having an effect of shortening a carrier lifetime overlap.

2. A semiconductor device comprising:

a first semiconductor layer of a first conductivity type;

a second semiconductor layer of a second conductivity type formed to produce a junction plane with said first semiconductor layer;

a first electrode facing said junction plane with said first semiconductor layer disposed therebetween;

a second electrode facing said junction plane with said second semiconductor layer disposed therebetween; and a plurality of defect layers separated from one another in one of said first and second semiconductor layer, wherein a distance separating any adjacent ones of said defect layers is not greater than twice of a carrier diffusion length of said defect layers such that short lifetime layers of said any adjacent ones of said defect layers overlap.

3. A semiconductor device according to claim 2, wherein the position where the largest number of defects are found in each one of said plurality of defect layers is located on a same single plane.

4. A semiconductor device according to claim 2, wherein the position where the largest numbers of defects are found in each one of said plurality of defect layers is located on different planes.

5. A semiconductor device comprising:

a first semiconductor layer of a first conductivity type;

a second semiconductor layer of a first conductivity type formed to produce a junction plane with said first semiconductor layer;

a first electrode facing said junction plane with said first semiconductor layer disposed therebetween;

a second electrode facing said junction plane with said second semiconductor layer disposed therebetween; and a defect layer in said second semiconductor layer, wherein a distance from each edge of said defect layer to a corresponding one of edges of said first semiconductor layer is greater than a carrier diffusion length of said defect layer such that carriers injected into said second semiconductor are effectively annihilated when said semiconductor device is turned off.

* * * * *